United States Patent [19]
Takahashi et al.

[11] Patent Number: 5,936,850
[45] Date of Patent: Aug. 10, 1999

[54] CIRCUIT BOARD CONNECTION STRUCTURE AND METHOD, AND LIQUID CRYSTAL DEVICE INCLUDING THE CONNECTION STRUCTURE

[75] Inventors: Masanori Takahashi, Chigasaki; Riichi Saito, Fujisawa; Toshimichi Ouchi, Yokohama, all of Japan

[73] Assignee: Canon Kabushiki Kaisha, Tokyo, Japan

[21] Appl. No.: 08/610,122

[22] Filed: Feb. 28, 1996

[30] Foreign Application Priority Data

Mar. 3, 1995 [JP] Japan .................................. 7-044558

[51] Int. Cl.⁶ ........................................................ H05K 1/14
[52] U.S. Cl. .......................... 361/784; 361/789; 361/792; 361/772; 361/776; 361/826; 361/827; 439/67; 439/493; 174/117 F; 174/117 FF
[58] Field of Search ................................. 361/784, 789, 361/792, 772, 776, 813, 826, 827, 681, 637, 749; 439/67, 493; 174/117 F, 117 FF

[56] References Cited

U.S. PATENT DOCUMENTS

| | | | |
|---|---|---|---|
| 4,832,455 | 5/1989 | Takeno et al. | 350/334 |
| 4,832,460 | 5/1989 | Fujimura et al. | 350/346 |
| 4,964,700 | 10/1990 | Takabayashi | 350/336 |
| 4,972,369 | 11/1990 | Akiba et al. | 365/2 |
| 4,975,871 | 12/1990 | Akiba et al. | 365/2 |
| 5,019,201 | 5/1991 | Yabu et al. | 156/273.9 |
| 5,150,231 | 9/1992 | Iwamoto et al. | 359/44 |
| 5,270,848 | 12/1993 | Takabayashi et al. | 359/88 |
| 5,360,943 | 11/1994 | Mori et al. | 174/84 R |
| 5,404,239 | 4/1995 | Hirai | 359/88 |
| 5,517,208 | 5/1996 | Mori et al. | 345/87 |
| 5,640,216 | 6/1997 | Hasegawa et al. | 349/58 |

FOREIGN PATENT DOCUMENTS

| | | |
|---|---|---|
| 0604893 | 7/1994 | European Pat. Off. . |
| 2178625 | 7/1990 | Japan . |

*Primary Examiner*—Leo P. Picard
*Assistant Examiner*—David Foster
*Attorney, Agent, or Firm*—Fitzpatrick,Cella,Harper & Scinto

[57] ABSTRACT

A circuit board connection structure is formed by a first substrate having a first electrode pattern, a second substrate having a second electrode pattern, and a film circuit member electrically connecting the first and second electrode patterns. The film circuit member includes lead electrodes having an exposed portion partly connected to the first electrode pattern at a part of the exposed portion closer to an edge of the film circuit member. The film circuit member may further includes lead electrodes having an exposed portion partly connected to the second electrode pattern at a part of the exposed portion closer to an edge of the film circuit member. The circuit board connection structure may be incorporated in various electronic devices, including a liquid crystal display device.

24 Claims, 5 Drawing Sheets

5,936,850

CIRCUIT BOARD CONNECTION STRUCTURE AND METHOD, AND LIQUID CRYSTAL DEVICE INCLUDING THE CONNECTION STRUCTURE

FIELD OF THE INVENTION AND RELATED ART

The present invention relates to a structure and a method of circuit board connection used in various electronic circuits as used in computer main frame and peripheral equipments, etc.

A conventional circuit board connection structure used in flat display devices having display electrodes arranged in the form of a matrix, such as EL display panels and liquid crystal display panels of the simple matrix-type and the active matrix-type, has been formed by connecting the connecting electrodes on a glass substrate or a plastic substrate of a display device and the output lead electrodes of a type carrier package (TCP) formed by the TAB (tape automated bonding) method by hot-pressure bonding and by connecting the input lead electrodes of the TCP and the connecting electrodes of a print circuit board (PCB, hereinafter sometimes called "PCB board") by solder bonding. Such circuit board connection structures have been disclosed in, e.g., U.S. Pat. Nos. 5,150,231, 4,964,700, 5,360,943, 5,019,201, etc.

An example of such a conventional connection structure is shown in FIG. 11. Referring to FIG. 11, output lead electrodes 6 of a TCP 2 are formed by patterning on a base film and connected to connecting electrodes 11 of a glass substrate 1b with ACF (anisotropic conductive film) 12 as shown in FIG. 11, wherein 5 denotes a resin coating and 20 denotes a sealant. On the other hand, input lead electrodes 7 of the TCP 2 are exposed locally to an opening formed by locally removing the base film and fixed by soldering to a solder land 10 of connecting electrodes of the PCB 4 as shown in FIG. 12 wherein 8 denotes a solder resist.

Because of such a connection structure, in case where the environmental temperature is changed from a low temperature (e.g., –20° C.) to a high temperature (e.g., 60° C.), a shearing force is liable to occur within the TCP 2 in a direction along a side of the glass substrate 1b on which the TCP 2 and the PCB 4 are disposed due to a difference in thermal expansion coefficient between the glass substrate 1b and the PCB board 4. Further, as the output lead electrodes 6 and input lead electrodes 7 are fixedly connected as described above, the part G of the TCP 2 connected to the glass substrate 1b receiving a concentrated stress and the exposed part G of the TCP 2 connected to the solder land 10 of the PCB board connecting electrodes and receiving a concentrated stress are liable to be broken to cause connection failure.

Further, the connecting part between a semiconductor chip mounted on the TCP and the connecting electrodes (inner leads) of the TCP is liable to be damaged to cause a connection failure. Also, the bonding connection between the output lead electrodes of the TCP and the glass substrate is liable to be peeled apart from each other to cause a connection failure.

Particularly, in the case of a liquid crystal display device having a diagonal size exceeding 10 inches, there arises a large size change or deviation due to a difference in thermal expansion between the glass substrate and the PCB board, thus being liable to cause such connection failures.

SUMMARY OF THE INVENTION

Accordingly, a principal object of the present invention is to provide a circuit board connection structure resistant to breakage due to an environmental temperature change, a method of providing such a connection structure, and a liquid crystal device including such a connection structure.

According to the present invention, there is provided a circuit board connection structure, comprising: a first substrate having a first electrode pattern, a second substrate having a second electrode pattern, and a film circuit member electrically connecting the first and second electrode patterns, wherein said film circuit member comprises lead electrodes having an exposed portion partly connected to the first electrode pattern at a part of the exposed portion closer to an edge of the film circuit member.

In the circuit board connection structure according to the present invention, the film circuit member is provided with an exposed lead electrode which is exposed to an opening formed by removing a portion of the film substrate of the film circuit member, and the exposed lead electrode is partly used for electrical connection to leave an unconnected portion so that, even if a shearing stress occurs in the film circuit member (TCP) due to a difference in thermal expansion between the first and second substrates (a glass substrate and a PCB board), a breakage or connection failure of the film circuit member can be prevented owing to deformation and stretching allowance of the unconnected lead electrode portion.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
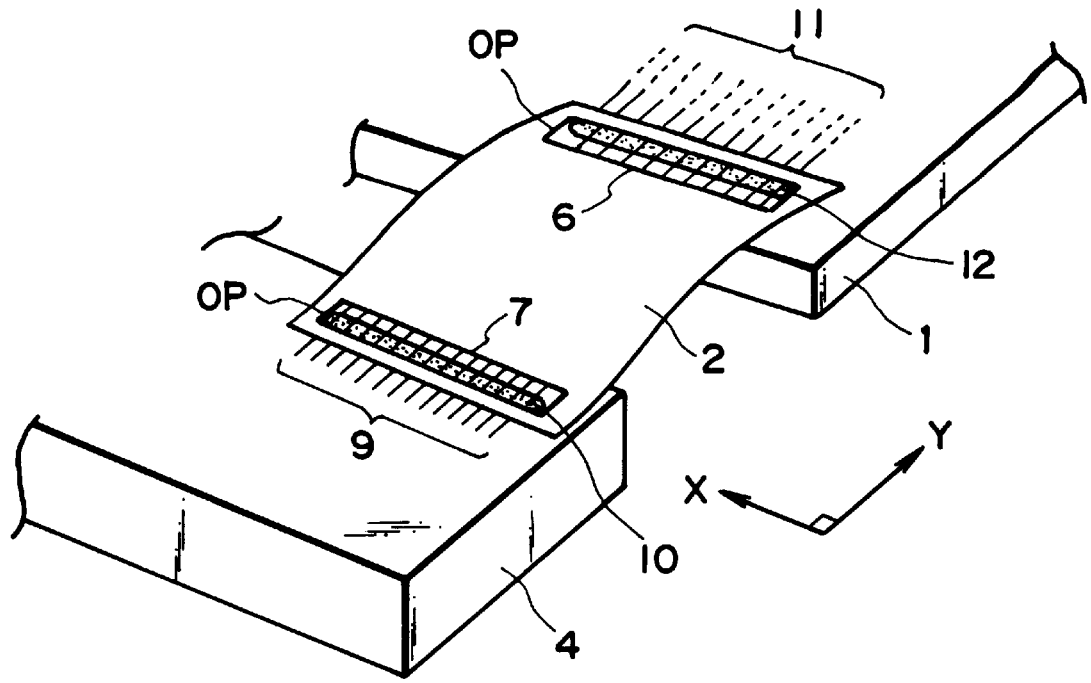
FIG. 1 is a partial perspective view of an electronic device including a circuit board connection structure according to an embodiment of the invention.
Figure 2:
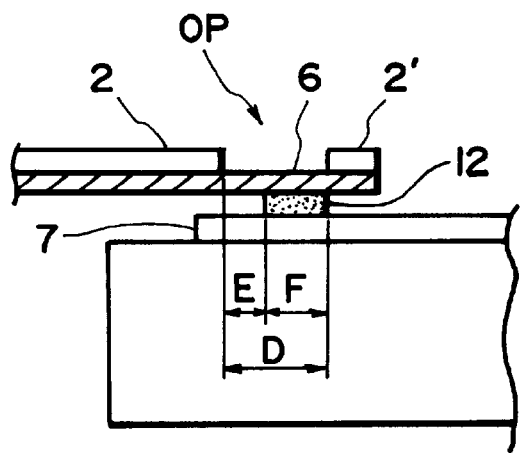
FIG. 2 is a partial sectional view of the connection structure shown in FIG. 1.

FIG. 1 is a partial sectional view of an electronic device (liquid crystal device) including a circuit board connection structure according to an embodiment of the present invention, and FIG. 2 is a partial sectional view of the connection structure.

Referring to these figures, the circuit board connection structure includes a first substrate 1 having thereon a first electrode pattern 11, a second substrate 4 having thereon a second electrode pattern 9, and a film circuit member 2 directly or indirectly connecting the first electrode pattern and the second electrode pattern. Herein, "indirect connection" refers to a mode of connection wherein the first electrode pattern 11 is connected to the second electrode pattern 9 via an integrated circuit mounted on the film circuit member 2.

The film circuit member 2 includes a laminated structure comprising at least an electrode pattern forming lead electrodes, and an insulating flexible film substrate comprising a relatively hard resin, such as polyester, polyimide or glass-reinforced epoxy resin.

The film circuit member 2 is provided with openings OP on both sides of connection with the electrode patterns 11 and 9, at which the insulating film is removed to expose the lead electrodes thereat and leave an insulating film portion 2' covering the end portions of the lead electrodes. In FIG. 1, the openings OP are provided in the form of an elongated hole elongated in a direction X in which lead electrodes are arranged (i.e., in a direction perpendicular to a direction Y in which the lead electrodes extend).

First lead electrodes 6 are connected to the first electrode pattern 11 with a first connecting member 12. Second lead electrodes 7 are connected to the second electrode pattern 9 with a second connecting member 10.

The first and second connecting members 12 and 10 are disposed only at a region F close to the ends of the lead electrodes and not at an inner region E of the exposed lead electrode portion.

The unconnected region E of the lead electrodes functions as a buffer or allowance for flexural deformation of the lead electrodes or the film circuit member.

The first and second substrates 1 and 4 may preferably comprise a rigid sheet material, such as a silicon plate, a quartz plate, a ceramic plate, a sapphire plate, a glass plate, a glass fiber-reinforced epoxy resin, or a polyimide resin plate.

The first and second connecting members 12 and 10 may comprise an electroconductive material, such as an anisotropic conductive adhesive of a thermoplastic-type, a thermosetting-type or a photosetting or photocurable-type, or solder.

With respect to an exposed portion length D of the lead electrodes, the unconnected exposed portion may have a length E which is desirably at least D/5, preferably at least D/4 and at most D/2, preferably at most 2D/5.

One of the lead electrodes 6 and 7 subjected to a relatively small degree of deformation can be connected without leaving an unconnected exposed part E.

Figure 3:
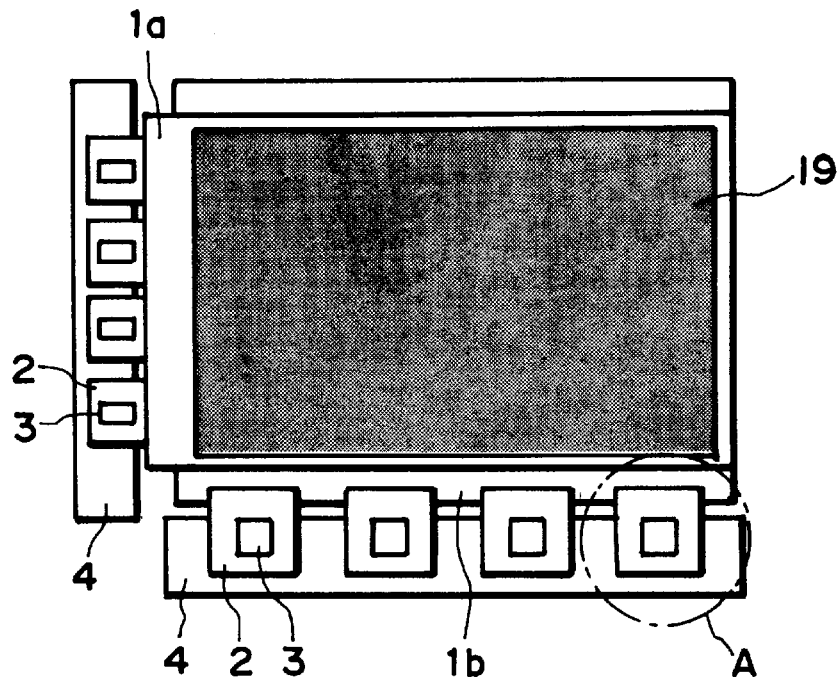
FIG. 3 is a schematic plan view of a liquid crystal display device including a circuit board connection structure according to an embodiment of the invention, including a connection of a liquid crystal panel and a PCB board with a film circuit member.

A liquid crystal display device as an embodiment the electronic device including a circuit board connection structure according to the present invention will now be described. FIG. 3 is a plan view of such a liquid crystal device, including a circuit board connection structure as described above, e.g., at a part A therein.

FIG. 3 shows a state wherein glass substrates 1a and 1b of the liquid crystal display device is connected with a film circuit member 2 carrying thereon a semiconductor chip 3 for driving the liquid crystal device, and the film circuit member is connected with a glass-epoxy PCB board 4. The liquid crystal display device includes a display area 19 at which a liquid crystal is disposed between the substrates 1a and 1b.

The liquid crystal used in the present invention may preferably comprise a chiral smectic liquid crystal showing ferroelectricity or anti-ferroelectricity, or a chiral nematic liquid crystal showing two quasi-stable states.

The liquid crystal device can be of a type in which only one of two substrates is provided with electrodes for supplying an electric field applied to the liquid crystal.

Figure 4:
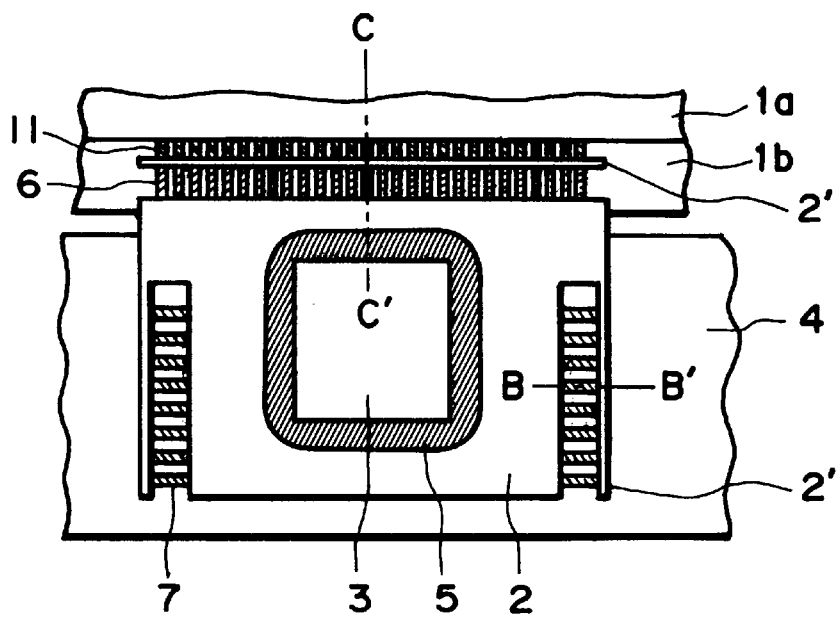
FIG. 4 is an enlarged partial view showing the connection structure at a portion A shown in FIG. 3.

FIG. 4 is a plan view of a connection structure suitably used at part A in FIG. 3. FIG. 4 shows only several tens of output lead electrodes but an actual liquid crystal device may include several hundreds or more of output lead electrodes.

At the part of connection with the electrode pattern 11 (of connection electrodes, i.e., scanning electrodes or data electrodes of an electrode matrix) on the glass substrate 11, the film substrate (insulating film) of the film circuit member 2 is removed to provide an opening at which the output lead electrodes 6 alone are connected to the connection electrodes 11. On the other hand, the input lead electrodes 7 of the film circuit member exposed by provision of an opening of the film circuit member 2 are connected by soldering onto solder-plated connecting electrodes on the glass-epoxy PCB board 4. Incidentally, a film substrate 2' is left unremoved at end portions of the lead electrodes.

Figure 5:
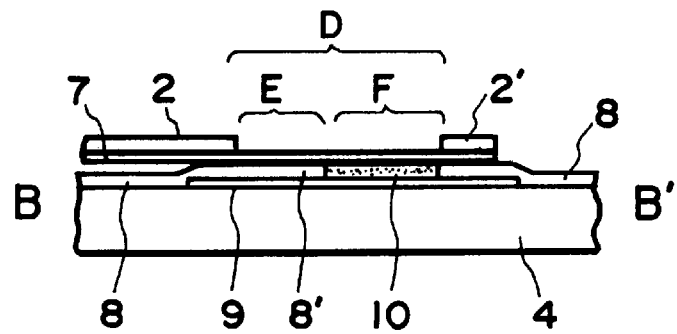
FIG. 5 is a sectional view taken along a B–B' line in FIG. 4.
Figure 6:
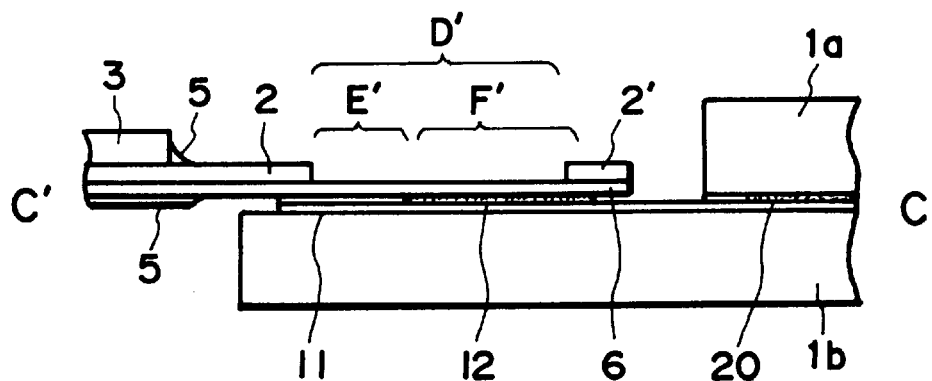
FIG. 6 is a sectional view taken along an A–A' line in FIG. 4.

FIGS. 5 and 6 are sectional views taken along B–B' line and C–C' line, respectively, in FIG. 4, for further illustrating the circuit board connection structure according to this embodiment.

Referring to FIG. 5, the input lead electrodes 7 of the film circuit member 2 are exposed through an opening of the film substrate at a range D. On the other hand, the connection electrodes 9 on the PCB board 4 are exposed through an opening of a solder resist 8 (of, e.g., melamine resin or epoxy resin for protection of surrounding members during soldering or provision of solder by plating) and instead provided with a plated solder 10 at a part corresponding to the near end region F of the input lead electrodes 7 of the film circuit member 2.

As a result, the input lead electrodes 7 of the film circuit member 2 are fixed by connection with the solder 10 only at the region F while leaving the unconnected exposed region of the lead electrons 7 at the region E.

In this embodiment, solder is used as the connecting member, but an anisotropic conductive adhesive can also be used to exhibit similar effects.

Referring to FIG. 6, the output lead electrodes 6 of the film circuit member 2 are exposed through an opening of the substrate film at a range D'.

On the other hand, the connection electrodes 11 on the glass substrate 1b are coated in advance with an anisotropic conductive adhesive film 12 at a part corresponding to the near end region F' of the output lead electrodes 6 of the film circuit member 2.

As a result, the output lead electrodes 6 of the film circuit member 2 are fixed by heat-bonding only at the region F' while leaving the unconnected exposed region of the lead electrodes 6 at the region E'. FIG. 6 also shows a resin coating 5 (of, e.g., epoxy-phenolic resin, optionally containing silica filler, for protecting the IC chip 3 and lead electrodes 6).

Figure 7:
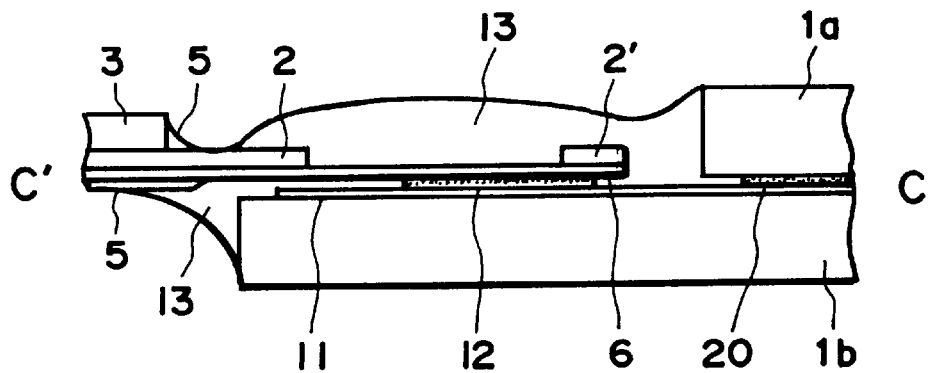
FIG. 7 is a sectional view of a connection structure shown in FIG. 6 further including a resin covering a connection between the film circuit member and the glass substrate.

FIG. 7 shows a modification of the connection structure shown in FIG. 6, wherein the electrode connection part is covered with a silicone resin coating 13 so as to improve the corrosion resistance and reinforce the electrodes 6, thereby providing an improved reliability of the connection structure. Even if the unconnected exposed portion E' of the electrodes 6 is coated with the silicone resin 13, the unconnected portion E' of the electrodes 6 is deformable if the silicone resin 13 has a rubber hardness of at most 50 deg., thereby relaxing a deformation stress applied to the film circuit member 2. The resin coating 13 can also comprise an elastomeric resin having a hardness (JIS A rubber hardness) of at most 50 deg. other than silicone resin.

More specifically, the resin coating 13 may preferably comprise an elastomeric resin having a rubber hardness (JIS A) of at most 50 deg., including silicone resin (such as "SE 9140", "PRX 305" and "SE 5004 (trade name)", available from Toray Silicone K.K.), as a preferred example. Such a resin coating 13 is much more resilient than the resin constituting the substrate of the film circuit member 2 comprising, e.g., polyester, polyimide or glass-epoxy resin. For example, the rubber hardness of at most 50 deg. roughly corresponds to a Shore hardness of 30A–60A which is much lower than Shore hardness of 90A–70D of polyester resin, a relatively soft substrate material.

Figure 8:
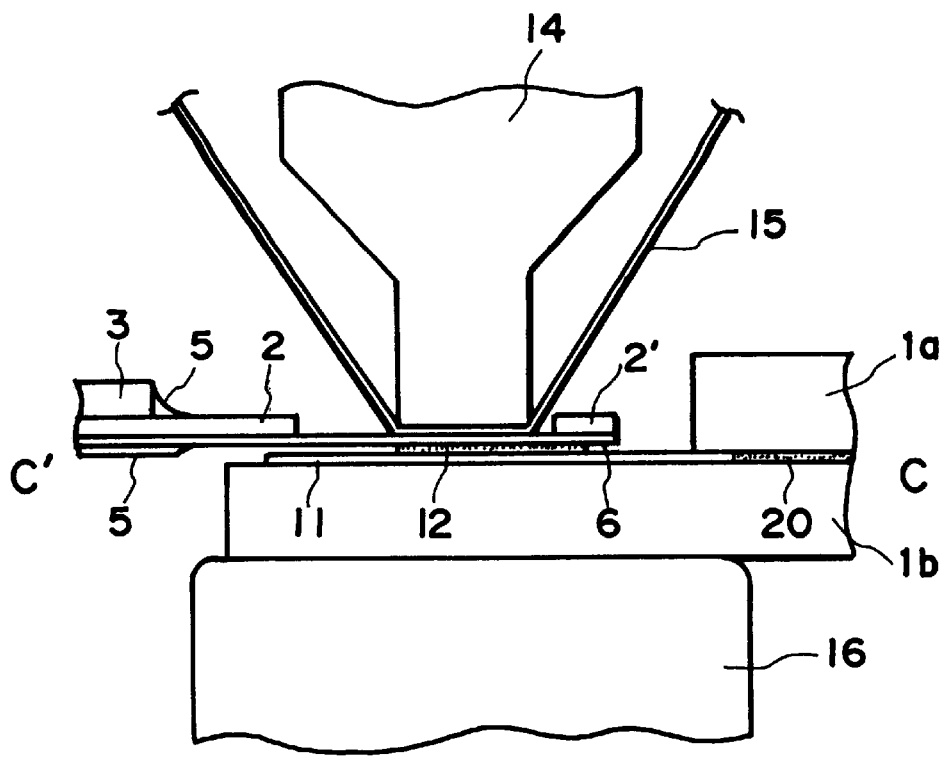
FIG. 8 is a sectional view for illustrating a manner of connecting the output lead electrodes of the film circuit member and the electrode pattern on the glass substrate.
Figure 9:
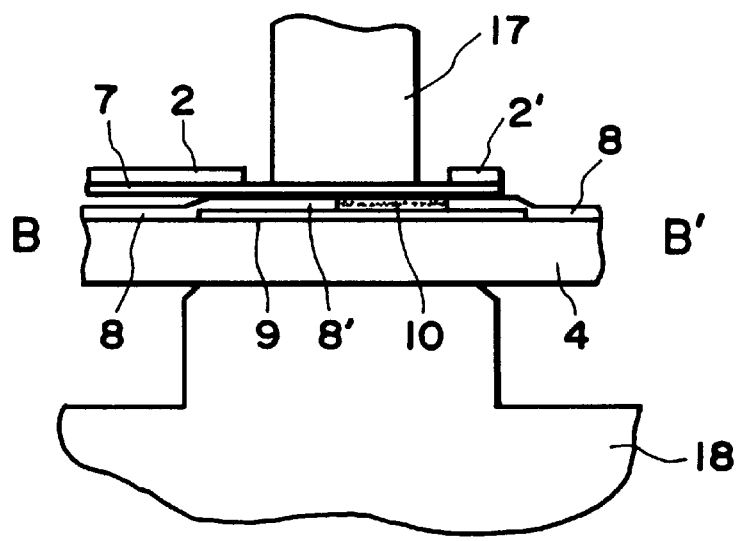
FIG. 9 is a sectional view for illustrating a manner of connecting the input lead electrodes of the film circuit member and the electrode pattern on the PCB board.

FIGS. 8 and 9 illustrate manners for electrode connection to provide a circuit board connection structure according to the present invention.

FIG. 8 illustrates a method of providing a circuit board connection structure shown in FIG. 6.

Referring to FIG. 8 again, the output electrodes 6 of the film circuit member 2 have been locally exposed at a region D' (FIG. 6).

On the other hand, an anisotropic conductive adhesive film 12 is placed in advance on the connecting electrodes 11 on the glass substrate 1b at a portion corresponding to the near end region F' (FIG. 6) of the output lead electrodes 6 of the film circuit member 2.

Then, a positional alignment is effected so that the portion (at region F' in FIG. 6) closer to the end portion 2' of the output lead electrodes 6 of the film circuit member 2 is aligned with the portion of the connecting electrodes 11 on the glass substrate 1b on which the anisotropic conductive adhesive film 12 is placed.

In the aligned state, the superposed electrode structure at a position corresponding to the region F' is heated via a pressing sheet 15 by a heat-press bonding head 14 heated to 150–300° C., thereby bonding the electrodes 6 and 11 with the melted adhesive 12.

By the locally relative heating at only the region F' by the heat-press bonding head 14, the heat-fusion of the anisotropic conductive adhesive film 12 to the region E' (FIG. 6) is minimized, to prevent the lead electrodes 6 from being fixed at the region E'.

In a specific example, the pressing sheet 15 comprised 0.05 mm-thick teflon film ("NITOFLON No. 900 U2", made by Nitto Denko K.K.) and was used for preventing the staining of the heat-press bonding head 14 with the anisotropic conductive adhesive film and for absorbing a slight inclination of the head and minute unevenness of the connecting electrodes to provide an improved reliability.

FIG. 9 illustrates a method of providing a circuit board connection structure shown in FIG. 5.

Referring to FIG. 9, the input lead electrodes 7 of the film circuit member 2 have been locally exposed at an opening by removing the substrate film at a range D (FIG. 5).

On the other hand, the connecting electrodes 9 of the PCB board 4 are provided with an opening of the solder resist at a part corresponding to the near end region F of the input lead electrodes of the film circuit member 2 and provided with a plated solder 10.

Then, a flux is applied onto the plated solder 10 on the connecting electrode of the PCB board 4, and a positional alignment is effected so that the portion (at region F in FIG. 5) closer to the end portion 2' of the input lead electrodes 7 of the film circuit member 2 is aligned with the portion of the connecting electrodes 9 of the PCB board 4 provided with the plated solder 10.

In the thus-aligned state, the superposed electrode structure sandwiching the solder resist 8' and the solder 10 is heat-pressed via the lead electrodes 7 by a heat-pressure bonding head 17 heated to 200–300° C., thereby fixedly connecting the electrodes 7 and 9. At the time of heat-pressure bonding, the portion E of the lead electrodes 7 is sandwiched between the heat-pressure bonding head 17 and the solder resist 8', so that the melted solder 10 is prevented from flowing up to the region E of the lead electrodes 7, thus preventing the fixation of the lead electrodes 7 at the region E.

In a specific example, the film circuit member 2 (FIG. 6) was provided with an opening having a width D' of 2.5 mm for exposing the output lead electrodes 6 and the unconnected exposed length E' of the lead electrodes 6 was 0.5–1 mm by using the heat-pressure bonding head 14 having a tip width of 1.5 mm (FIG. 8). On the other hand, the film circuit member (as shown in FIG. 5) was provided with an opening having a width D of 2 mm and the unconnected exposed length E of 0.5–1 mm by using a heat-pressure bonding head 17 of 1.2 mm. The above values are raised as mere exemplary values and other sizes may also be used within a scope of the present invention.

Figure 10:
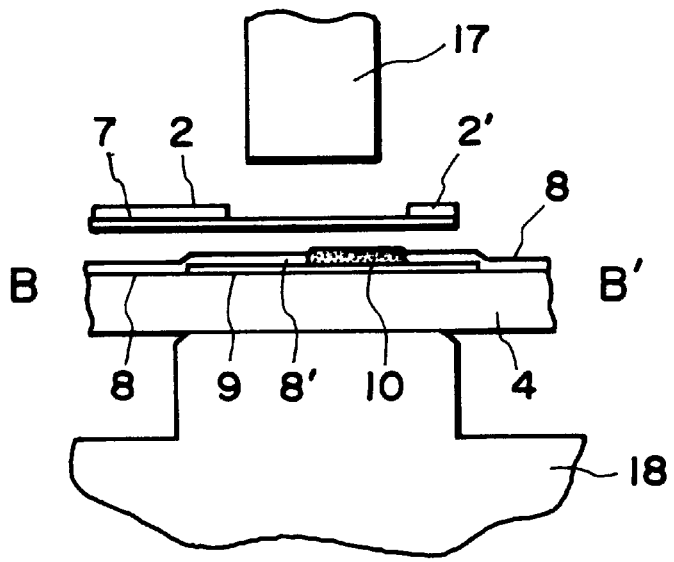
FIG. 10 is a sectional view showing a circuit board connection structure according to the invention wherein the PCB board having an electrode soldering part having a height larger than that of an adjacent solder resist.

FIG. 10 shows a state of the connecting electrodes 9 on the PCB board 4 and the input lead electrodes 7 of the film circuit member 2 immediately before the connection therebetween by the heat-pressure bonding head 17 and, as shown, the solder 10 has a height larger than that of the surrounding solder resist 8', whereby a sufficient contact is ensured between the lead electrodes 7 and the solder 10 at the time of the heat-pressure bonding by the head to effect a good connection.

For example, in the case of using a ferroelectric liquid crystal in a liquid crystal display device, the circuit board connection structure according to the present invention may be subjected to an elevated temperature of ca. 100° C. for placing the liquid crystal in an isotropic state for alignment of the liquid crystal. However, the circuit board connection structure according to the present invention may be durable against a shearing stress along a side of a glass substrate along which the film circuit members and the PCB board is disposed caused by a difference in thermal expansion occurring due to a temperature difference between room temperature and such an elevated temperature, because of a deformation or elongation allowance at the unconnected exposed portions of the lead electrodes 7 and 6 at the regions E and E'.

In a specific example, the PCB board 4 was composed of a 4 to 6-layered glass-epoxy board of FR4 grade (according to NEMA standard) showing a thermal expansion coefficient of 0.08–0.125 ($\times 10^{-2}$ cm/cm/° C.) close to that of the glass substrates 1a and 1b so as to minimize the shearing force occurring in the film circuit member along the side of the glass substrate even in an environmental temperature change from a low temperature (e.g., −20° C.) to a high temperature (e.g., 60° C.). However, as a general property, such a multi-layer glass-epoxy board of FR4 is liable to cause a heat-shrinkage of 0.02–0.025% at an elevated temperature, which is liable to increase the shearing force occurring in the film circuit member along a side of glass substrate.

In consideration of such a heat shrinkage, it is sometimes desirable to subject a PCB board 4 to an aging treatment at a temperature of 60° C. or higher before the connection thereof with the film circuit member 2, thereby to cause such a heat-shrinkage in advance and reduce the shrinkage in the actual assemblage thereof.

Incidentally, in the above embodiment, the film circuit member 2 is provided with an opening both with respect to the input lead electrodes and the output lead electrodes, it is possible to provide such an opening to only one side of the input and output lead electrodes.

As described above, according to this embodiment, at at least one of the connection between the glass substrate (1a, 1b) and the film circuit member 2 and the connection between the film circuit member 2 and the PCB board 4, the film circuit member 2 is provided with an opening by removal of the film substrate thereof to expose metal lead electrodes, of which only a portion close to the connection is connected to leave a farther unconnected exposed metal lead portion. The unconnected exposed portion of the lead electrodes retains a deformation allowance in a direction of arrangement of the lead electrodes at a region E or E' (in FIGS. 5 or 6) and an elongation allowance in the direction of extension thereof at a region E or E' (in FIGS. 5 or 6). As a result, even if a shearing force occurs along a side of the glass substrate (1a, 1b) along which the film circuit members 2 and the PCB board 4 are arranged due to a difference in thermal expansion between the glass substrate (1a, 1B) and the PCB board 4 caused by a change in environmental temperature from a low temperature (e.g., −20° C.) to a high temperature (e.g., 60° C.), it becomes possible to obviate difficulties, such as a breakage of exposed lead electrodes having a weak mechanical strength fixed by soldering to the connecting electrodes on the PCB board 4, a breakage of a connection between a semiconductor chip mounted on the film circuit member and connection electrodes (inner leads) of the film circuit member, and a peeling of a connection between the output lead electrodes and the connecting electrodes (scanning electrodes or data electrodes) on the glass substrate (1a or 1b), thereby providing an improved reliability in various environments for use.

Further, in this embodiment shown in FIGS. 4 and 5, the input lead electrodes 7 of the film circuit member 2 and the solder lands 10 on the connecting electrodes 9 on the PCB board 4 are arranged in rows in a direction perpendicular to a side of the glass substrate 1b. In such a structure, if a shearing force occurs in the film circuit member 2 along the side of the glass substrate 1b along which the film circuit members 2 and the PCB board 4 are arranged, the input lead electrodes 7 of the film circuit member 2 are supplied with a pulling force. However, the input lead electrode 7 are provided with an unconnected portion rich in deformation and elongation allowance according to the present invention, so that breakage of the lead electrodes or a connection failure of the film circuit member 2 can be obviated.

As described above, according to the present invention, at at least one of the connection between the glass substrate and the film circuit member and the connection between the film circuit member and the PCB board, the film circuit member is provided with an opening to expose the metal lead electrodes of the film circuit member, of which only a portion close to the connection is connected to leave a farther unconnected portion, so that the unconnected portion absorbs a stress due to a difference in thermal expansion caused by a change in environmental temperature, whereby the breakage of the connections is prevented to provide an improved reliability of the product.

What is claimed is:

1. A circuit board connection structure, comprising:
   a first substrate having a first electrode pattern, a second substrate having a second electrode pattern, and a film circuit member electrically connecting the first and second electrode patterns,
   wherein said film circuit member comprises lead electrodes each having a tip portion adjacent to an edge of the film circuit member and covered with an insulating film and an exposed portion adjacent to said tip portion, said exposed portion including a part closer to said tip portion and connected to the first electrode pattern and a remaining part farther from said tip portion and not connected to the first electrode pattern.

2. A connection structure according to claim 1, wherein the lead electrodes have a tip portion covered with an insulating film.

3. A connection structure according to claim 1, wherein said exposed portion of the lead electrodes has a length D including the connected part having a length F satisfying $D-F \geq D/5$.

4. A connection structure according to claim 3, wherein a relationship of $D-F \leq D/2$ is satisfied.

5. A connection structure according to claim 1, wherein said exposed portion of the lead electrodes has a length D including the connected part having a length F satisfying $D/5 \leq D-F \leq 2D/5$.

6. A connection structure according to claim 1, wherein said exposed portion of the lead electrodes has a length D including the connected part having a length F satisfying $D/4 \leq D-F \leq D/2$.

7. A connection structure according to claim 1, wherein said film circuit member further comprises lead electrodes having an exposed portion partly connected to the second electrode pattern at a part of the exposed portion closer to an edge of the film circuit member.

8. A connection structure according to claim 1, wherein said lead electrodes retain an extended portion covered with an insulating film, which extended portion is also connected to the first electrode pattern.

9. A connection structure according to claim 1, wherein said first and second substrates are non-flexible.

10. A circuit board connection structure comprising:
    a first substrate having a first electrode pattern;
    a second substrate having a second electrode pattern; and
    a film circuit member electrically connecting the first and second electrode patterns,
    wherein said film circuit member comprises lead electrodes having an exposed portion partly connected to the first electrode pattern at a part of the exposed portion closer to an edge of the film circuit member, and
    wherein said first substrate is one of a pair of substrates between which a chiral smectic or chiral nematic liquid crystal is disposed.

11. A connection structure according to claim 1, wherein said film circuit member carries an integrated circuit chip thereon.

12. A connection structure according to claim 11, wherein said integrated circuit chip is electrically connected to the first electrode pattern and the second electrode pattern.

13. A circuit board connection structure, comprising:
   a first substrate having thereon a multiplicity of electrodes arranged along a side thereof,
   a film circuit member comprising first lead electrodes and second lead electrodes, and an insulating film generally covering the first lead electrodes and the second lead electrodes,
   a first circuit member electrically connecting the multiplicity of electrodes and the first lead electrodes,
   a second substrate disposed in parallel with the side of the first substrate and having thereon a plurality of electrodes, and
   a second connecting member electrically connecting the plurality of electrodes and the second lead electrodes,
   wherein each of said first and second lead electrodes is provided with a tip portion adjacent to an edge of the film circuit member and covered with an insulating film, and an exposed portion including a connected part closer to the tip portion and a remaining non-connected part farther from the tip portion.

14. A connection structure according to claim 13, wherein said multiplicity of electrodes extend in a direction perpendicular to said side of the first substrate and are arranged in parallel in a direction along said side, and said second lead electrodes of the film circuit member extend in a direction parallel to said side of the first substrate and arranged in parallel in a direction perpendicular to said side.

15. A connection structure according to claim 13, wherein at least one of said first and second connecting members is formed of an anisotropically conducive adhesive.

16. A connection structure according to claim 13, wherein said second connecting member comprises solder.

17. A connection structure according to claim 13, wherein said first substrate comprises a glass substrate of a liquid crystal display device, and said film circuit member comprises a tape carrier package carrying a semiconductor device for driving the liquid crystal display device.

18. A connection structure according to claim 13, wherein said plurality of electrodes formed on the second substrates are provided with a plated solder at a part thereof closer to the second lead electrodes on the film circuit member and a solder resist surrounding the plated solder.

19. A connection structure according to claim 18, wherein said plated solder has a height larger than that of the solder resist.

20. A connection structure according to claim 13, wherein said second substrate has been subjected to an aging treatment at a temperature of 60° C. or higher.

21. A method of circuit board connection, comprising the steps of:
   (a) electrically connecting a multiplicity of electrodes arranged along a side of and on a first substrate and first lead electrodes on a film circuit member with a first connecting member at a first connection position, and
   (b) electrically connecting a plurality of electrodes formed on a second substrate disposed in parallel to the side of the first substrate and second lead electrodes on the film circuit member with a second connecting member at a second connection position, wherein
   said step (a) comprises placing an anisotropic conductive adhesive on a portion of the multiplicity of electrodes on the first substrate at the first connection position, superposing the first lead electrodes thereon so as to align a portion of the first lead electrodes closer to an and of the first lead electrodes, with the placed anisotropic conductive adhesive, and heat-pressing the superposed first lead electrodes at said portion thereof with a heat-pressure bonding head, and
   wherein each of the first and second lead electrodes is provided with a tip portion adjacent to an edge of the film circuit member and covered with an insulating film, and an exposed portion including a connected part closer to the tip portion and a remaining non-connected part farther from the tip portion.

22. A connection structure according to claim 21, wherein said step (b) comprises plating a solder on a portion of the plurality of electrodes on the second substrate at the second connection position surrounded by a solder resist, applying a flux onto the plated solder, superposing the second lead electrodes thereon so as to align a portion of the second lead electrodes close to an end of the second lead electrodes with the plated solder, and heatpressing the superposed second lead electrodes at said portion thereof with a heat-pressure bonding head having a tip covering a boundary between the plate solder and the solder resist surrounding the plated solder.

23. A liquid crystal device, comprising a pair of substrates, and a liquid crystal disposed between the substrates,
   wherein one of said pair of substrates is one of the following first and second substrates included in a circuit board connection structure comprising:
   said first substrate having a first electrode pattern, a second substrate having a second electrode pattern, and a film circuit member electrically connecting the first and second electrode patterns,
   wherein said film circuit member comprises lead electrodes having an exposed portion partly connected to the first electrode pattern at a part of the exposed portion closer to an edge of the film circuit member, and
   wherein each of the first and second lead electrodes is provided with a tip portion adjacent to an edge of the film circuit member and covered with an insulating film, and an exposed portion including a connected part closer to the tip portion and a remaining non-connected part farther from the tip portion.

24. A liquid crystal device, comprising a pair of substrates, and a liquid crystal disposed between the substrates,
   wherein one of said pair of substrates is one of the following first and second substrates included in a circuit board connection structure comprising:
   said first substrate having a first electrode pattern, a second substrate having a second electrode pattern, and a film circuit member electrically connecting the first and second electrode patterns,
   wherein said film circuit member comprises lead electrodes having an exposed portion partly connected to the first electrode pattern at a part of the exposed portion closer to an edge of the film circuit member, and
   wherein said liquid crystal is a chiral smectic liquid crystal.

* * * * *

UNITED STATES PATENT AND TRADEMARK OFFICE
CERTIFICATE OF CORRECTION

PATENT NO. : 5,936,850
DATED : August 10, 1999
INVENTOR(S) : MASANORI TAKAHASHI ET AL.

It is certified that error appears in the above-identified patent and that said Letters Patent is hereby corrected as shown below:

ON THE TITLE PAGE [57] ABSTRACT:

Line 9, "includes" should read --include--.

Figure 11:
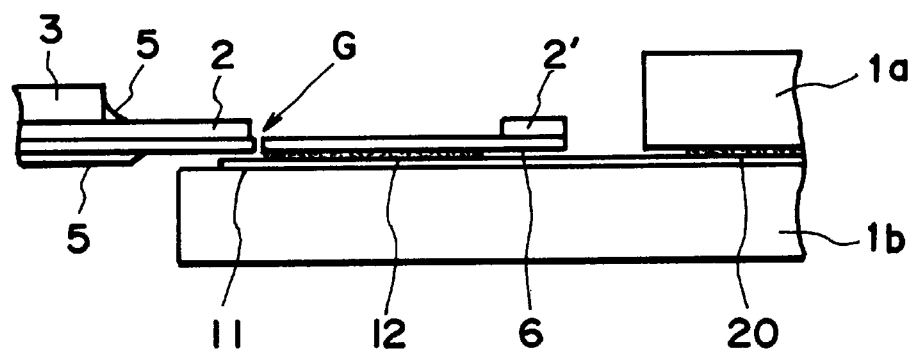
FIG. 11 is a sectional view showing a conventional circuit board connection structure showing a breakage of an input lead electrode of a film circuit member at a connection with a PCB board.
Figure 12:
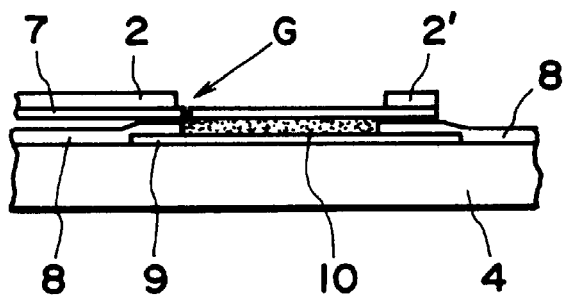
FIG. 12 is a sectional view showing a conventional circuit board connection structure showing a breakage of an output lead electrode of a film circuit member at a connection with a glass substrate.
Figure 10:
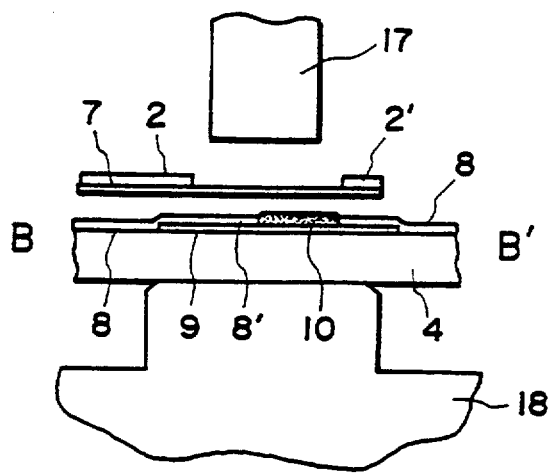
Figure 11:
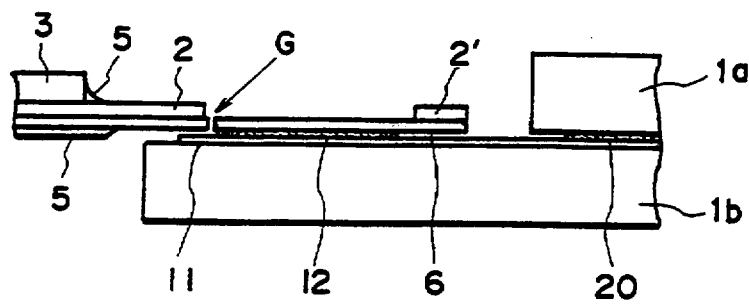
Figure 12:
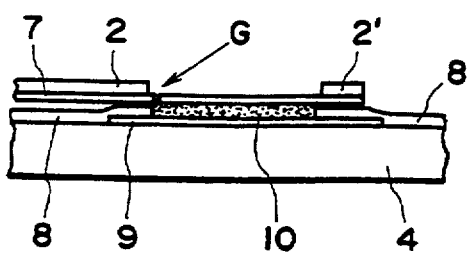

SHEET 5:

FIGS. 10-12, replace Sheet 5, Figs. 10-12 with attached amended sheet of Figs. 10-12.

COLUMN 2:

Line 61, "having an" should read --has an--.

COLUMN 3:

Line 66, "the" should read --of the--.

COLUMN 8:

Line 26-28, Claim 2 should be deleted.

UNITED STATES PATENT AND TRADEMARK OFFICE
CERTIFICATE OF CORRECTION

PATENT NO. : 5,936,850

DATED : August 10, 1999

INVENTOR(S) : MASANORI TAKAHASHI ET AL.

It is certified that error appears in the above-identified patent and that said Letters Patent is hereby corrected as shown below:

COLUMN 10:

Line 4, "and" should read --end--.

Signed and Sealed this

Twentieth Day of February, 2001

Attest:

NICHOLAS P. GODICI

Attesting Officer     Acting Director of the United States Patent and Trademark Office